United States Patent
Park et al.

(10) Patent No.: US 9,627,556 B2
(45) Date of Patent: *Apr. 18, 2017

(54) COMPOSITION FOR FORMING ELECTRODE OF SOLAR CELL AND ELECTRODE MANUFACTURED BY USING SAME

(71) Applicant: CHEIL INDUSTRIES, INC., Gumi-si, Gyeongsangbuk-do (KR)

(72) Inventors: Sang Hee Park, Uiwang-si (KR); Dong Il Shin, Uiwang-si (KR)

(73) Assignee: Cheil Industries, Inc., Gumi-Si, Gyeongsangbuk-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/758,041

(22) PCT Filed: Dec. 11, 2013

(86) PCT No.: PCT/KR2013/011467
§ 371 (c)(1),
(2) Date: Jun. 26, 2015

(87) PCT Pub. No.: WO2014/104618
PCT Pub. Date: Jul. 3, 2014

(65) Prior Publication Data
US 2015/0364621 A1    Dec. 17, 2015

(30) Foreign Application Priority Data

Dec. 29, 2012  (KR) .................. 10-2012-0157690
Dec. 9, 2013   (KR) .................. 10-2013-0152675

(51) Int. Cl.
*H01L 31/0224*   (2006.01)
*H01L 31/18*     (2006.01)

(52) U.S. Cl.
CPC .. *H01L 31/022425* (2013.01); *H01L 31/1884* (2013.01); *Y02E 10/50* (2013.01); *Y02P 70/521* (2015.11)

(58) Field of Classification Search
CPC .................................................. H01L 31/022425
(Continued)

(56) References Cited

U.S. PATENT DOCUMENTS 5,782,945 A * 7/1998 Gavin .................. C03C 8/18
                                                          427/125
8,696,945 B2 * 4/2014 Wu ...................... H01B 1/22
                                                          252/512

(Continued)

FOREIGN PATENT DOCUMENTS

CN  102027600 A   4/2011
CN  102456427 A   5/2012
(Continued)

OTHER PUBLICATIONS

Office Action mailed Aug. 12, 2015 in corresponding Taiwanese Patent Application No. 102147944.
(Continued)

*Primary Examiner* — Moazzam Hossain
(74) *Attorney, Agent, or Firm* — Lee & Morse, P.C.

(57) ABSTRACT

The present invention relates to a composition for preparing solar cell electrodes including: a silver (Ag) powder; a glass frit containing about 0.1 mole % to about 50 mole % of elemental silver; and an organic vehicle, the composition introduces a glass frit including a silver cyanate or a silver nitrate to enhance contact efficiency between an electrode and a wafer, and solar cell electrodes prepared from the composition have minimized contact resistance (Rc) and serial resistance (Rs), thereby exhibiting excellent conversion efficiency.

9 Claims, 1 Drawing Sheet

(58) Field of Classification Search
USPC .............. 257/40; 136/256; 252/514; 438/98
See application file for complete search history.

(56) References Cited

U.S. PATENT DOCUMENTS

| | | | | |
|---|---|---|---|---|
| 2006/0102228 | A1* | 5/2006 | Sridharan | ................ C03C 3/07 |
| | | | | 136/256 |
| 2009/0056798 | A1* | 3/2009 | Merchant | ................ H01B 1/16 |
| | | | | 136/256 |
| 2009/0101190 | A1* | 4/2009 | Salami | ................ C03C 3/062 |
| | | | | 136/244 |
| 2010/0244205 | A1 | 9/2010 | Prunchak | |
| 2011/0095240 | A1* | 4/2011 | Nakamura | ............. C03C 3/062 |
| | | | | 252/514 |
| 2011/0147678 | A1* | 6/2011 | Kim | ........................ H01B 1/22 |
| | | | | 252/519.3 |
| 2012/0199192 | A1 | 8/2012 | Akimoto et al. | |
| 2012/0247550 | A1 | 10/2012 | Kim et al. | |
| 2012/0325308 | A1* | 12/2012 | Kim | ............... H01L 31/022425 |
| | | | | 136/256 |
| 2013/0098431 | A1* | 4/2013 | Chen | .............. H01L 31/022425 |
| | | | | 136/252 |
| 2014/0008587 | A1* | 1/2014 | Yoshida | ................... C03C 8/02 |
| | | | | 252/513 |
| 2014/0318618 | A1* | 10/2014 | Paik | ...................... B22F 1/0018 |
| | | | | 136/256 |
| 2015/0221789 | A1* | 8/2015 | Hang | ...................... H01B 1/22 |
| | | | | 136/256 |

FOREIGN PATENT DOCUMENTS

| | | |
|---|---|---|
| CN | 102592706 A | 7/2012 |
| JP | 2011-096747 A | 5/2011 |
| KR | 10-2010-0069699 A | 6/2010 |
| KR | 10-2011-0069593 A | 6/2011 |
| KR | 10-1552745 B1 | 9/2015 |
| TW | 201007957 A1 | 2/2010 |
| TW | 201013703 A1 | 4/2010 |

OTHER PUBLICATIONS

Korean Office Action dated Apr. 27, 2016 in Corresponding Korean Patent Application No. 10-2013-0152675.
Chinese Office Action dated Feb. 23, 2016.

\* cited by examiner

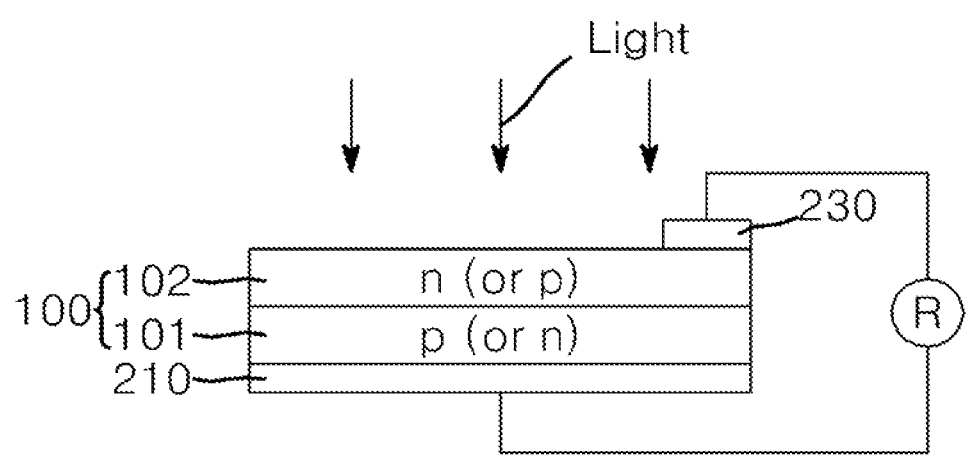

COMPOSITION FOR FORMING ELECTRODE OF SOLAR CELL AND ELECTRODE MANUFACTURED BY USING SAME

CROSS REFERENCE TO RELATED APPLICATIONS

This is the U.S. national phase application of PCT Application No. PCT/KR2013/011467, filed on Dec. 11, 2013, which is based on Korean Patent Application No. 10-2012-0157690, filed on Dec. 29, 2012, and Korean Patent Application No. 10-2013-0152675, filed on Dec. 9, 2013, the entire contents of all of which are hereby incorporated by reference.

TECHNICAL FIELD

The present invention relates to a composition for forming solar cell electrodes and electrodes prepared using the same.

BACKGROUND ART

Solar cells generate electricity using the photovoltaic effect of a p-n junction which converts photons of sunlight into electricity. In the solar cell, front and rear electrodes are formed on upper and lower surfaces of a semiconductor wafer or substrate with the p-n junctions, respectively. Then, the photovoltaic effect at the p-n junction is induced by sunlight entering the semiconductor wafer and electrons generated by the photovoltaic effect at the p-n junction provide electric current to the outside through the electrodes. The electrodes of the solar cell are formed on the wafer by applying, patterning, and baking an electrode composition.

Continuous reduction in emitter thickness to improve solar cell efficiency may cause shunting which may deteriorate solar cell performance. In addition, solar cells have been gradually increased in area to achieve higher efficiency. In this case, however, there may be a problem of efficiency deterioration due to increase in solar cell contact resistance.

Therefore, there is a need for a composition for solar cell electrodes that may enhance contact efficiency between electrodes and a silicon wafer to minimize contact resistance (Rc) and serial resistance (Rs), thereby providing excellent conversion efficiency.

DISCLOSURE

Technical Problem

It is one object of the present invention is to provide a composition for solar cell electrodes which exhibits excellent contact efficiency between an electrode and a surface of a wafer.

It is another object of the present invention is to provide a composition for solar cell electrodes capable of minimizing contact resistance and serial resistance.

It is a further object of the present invention is to provide a composition for solar cell electrodes having excellent conversion efficiency and fill factor.

It is further object of the present invention is to provide solar cell electrodes from the composition.

The above and other objects can be achieved by the present invention described in detail in the following.

TECHNICAL SOLUTION

Advantageous Effects

In accordance with one aspect of the invention, a composition for solar cell electrodes may include a silver (Ag) powder; a glass frit containing about 0.1 mole % to about 50 mole % of elemental silver; and an organic vehicle.

The elemental silver may derive from silver cyanide or silver nitrate.

The composition may include about 60% by weight (wt %) to about 95 wt % of the silver powder; about 0.1 wt % to about 20 wt % of the glass frit; and about 1 wt % to about 30 wt % of the organic vehicle.

The glass frit may contain about 0.9 mole % to about 45 mole % of elemental silver based on a total mole number of the glass frit.

The glass frit may be formed of silver cyanide, silver nitrate or a mixture thereof; and at least one kind of metal oxide.

The metal oxide may include at least one metal oxide selected from the group consisting of lead (Pb), bismuth (Bi), tellurium (Te), phosphorus (P), germanium (Ge), gallium (Ga), cerium (Ce), iron (Fe), lithium (Li), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al) oxides.

The glass frit may have an average particle diameter (D50) of about 0.1 μm to about 10 μm.

The composition may further include at least one additive selected from the group consisting of dispersants, thixotropic agents, plasticizers, viscosity stabilizers, anti-foaming agents, pigments, UV stabilizers, antioxidants, and coupling agents.

In accordance with another aspect of the invention, a solar cell electrode formed of the composition for solar cell electrodes is provided.

Advantageous Effects

A composition for preparing solar cell electrodes according to the present invention introduces a glass frit including silver cyanate or silver nitrate to enhance contact efficiency between an electrode and a wafer, and solar cell electrodes prepared from the composition have minimized contact resistance (Rc) and serial resistance (Rs), thereby exhibiting excellent conversion efficiency.

DESCRIPTION OF DRAWINGS

FIG. 1 is a schematic view of a solar cell in accordance with one embodiment of the present invention.

BEST MODE

Composition for Solar Cell Electrodes

A composition for solar cell electrodes according to the present invention includes a silver (Ag) powder (A); a glass frit containing elemental silver (B); and an organic vehicle (C). Now, each component of the composition for solar cell electrodes according to the present invention will be described in more detail.

(A) Silver Powder

The composition for solar cell electrodes according to the invention includes a silver (Ag) powder as a conductive powder. The particle size of the silver powder may be on nanometer or micrometer scale. For example, the silver powder may have a particle size of dozens to several hundred nanometers, or several to dozens of micrometers. Alternatively, the silver powder may be a mixture of two or more types of silver powders having different particle sizes.

The silver powder may have a spherical, flake or amorphous shape.

The silver powder preferably has an average particle diameter (D50) of about 0.1 μm to about 10 μm, more preferably about 0.5 μm to about 5 μm. The average particle diameter may be measured using, for example, a Model 1064D (CILAS Co., Ltd.) after dispersing the conductive powder in isopropyl alcohol (IPA) at 25° C. for 3 minutes via ultrasonication. Within this range of average particle diameter, the composition may provide low contact resistance and low line resistance.

The silver powder may be present in an amount of about 60 wt % to about 95 wt % based on the total weight of the composition. Within this range, the conductive powder may prevent deterioration in conversion efficiency due to increase in resistance and difficulty in forming the paste due to relative reduction in amount of the organic vehicle. Advantageously, the conductive powder may be present in an amount of about 70 wt % to about 90 wt %.

(B) Glass Frit Containing Elemental Silver

The glass frit serves to enhance adhesion between the conductive powder and the wafer or the substrate and to form silver crystal grains in an emitter region by etching an anti-reflection layer and melting the silver powder so as to reduce contact resistance during the baking process of the composition for electrodes. Further, during the baking process, the glass frit softens and lowers the baking temperature.

When the area of the solar cell is increased in order to improve solar cell efficiency, there may be a problem of increase in solar cell contact resistance. Thus, it is necessary to minimize both serial resistance (Rs) and influence on the p-n junction. In addition, as the baking temperatures varies within a broad range with increasing use of various wafers having different sheet resistances, it is desirable that the glass frit secure sufficient thermal stability to withstand a wide range of baking temperatures.

In one embodiment, the glass frit is formed of silver cyanide (AgCN), silver nitrate ($AgNO_3$), or a mixture thereof, and at least one kind of metal oxide. Specifically, the glass frit may be prepared by mixing, melting, and pulverizing silver cyanide (melting point: 335° C.), silver nitrate (melting point: 444° C.), or a mixture thereof, all of which have a melting point lower than silver (Ag), and a metal oxide. The metal oxide may include at least one kind of metal oxide.

The metal oxide may include at least one metal oxide selected from the group consisting of lead (Pb), bismuth (Bi), tellurium (Te), phosphorus (P), germanium (Ge), gallium (Ga), cerium (Ce), iron (Fe), lithium (Li), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al) oxides.

The glass frit may contain about 0.1 mole % to about 50 mole % of elemental silver, preferably about 0.9 mole % to about 45 mole % of elemental silver, based on the total mole number of the glass frit.

The content of elemental silver may be measured by an inductively coupled plasma-optical emission spectrometry (ICP-OES). ICP-OES requires a very small sample amount, and thus may shorten sample set-up time and reduce errors due to pre-treatment of the sample while providing excellent analytical sensitivity.

Specifically, ICP-OES may include pre-treating a sample, preparing a standard solution, and calculating the content of elemental silver in a glass frit by measuring and converting the concentration of the elemental silver (Ag), thereby enabling accurate measurement of the content of elemental silver in the glass frit.

In operation of pre-treating a sample, a predetermined amount of the sample may be dissolved in an acid solution capable of dissolving an analysis target, that is, silver (Ag) in a sample glass frit, and then heated for carbonization. The acid solution may include a sulfuric acid ($H_2SO_4$) solution.

The carbonized sample may be diluted with a solvent, such as distilled water or hydrogen peroxide ($H_2O_2$), to an appropriate extent that allows analysis of elemental silver. In view of element detection capability of an inductively coupled plasma-optical emission spectrometer (ICP-OES), the carbonized sample may be diluted 10,000 times.

In measurement with the ICP-OES, the pre-treated sample may be calibrated using a standard solution, for example, an elemental silver standard solution (Ag+1000 mg/L) for measuring elements.

By way of example, calculation of the content of elemental silver in the glass frit may be accomplished by introducing the standard solution into the ICP-OES and plotting a calibration curve with an external standard method, followed by measuring and converting the concentration (ppm) of elemental silver in the pre-treated sample using the ICP-OES.

Solar cell electrodes manufactured from the glass frit according to the present invention may have Ag crystals precipitated on the glass frit in addition to Ag crystals formed from the conductive powder after baking. Moreover, elemental silver deriving from silver cyanide or silver nitrate may impart conductivity to glass that is formed between the Ag crystals and a wafer on the glass frit and acts as an insulator between the Ag crystals and the wafer, and may fill isolated pores or voids on the glass frit, thereby reducing contact resistance and serial resistance of the wafer-silver electrodes.

The glass frit may be prepared from such metal oxides by any typical method known in the art. For example, the metal oxides may be mixed in a predetermined ratio. Mixing may be carried out using a ball mill or a planetary mill. The mixture is incited at 700° C. to 1300° C., followed by quenching to 25° C. The obtained resultant is subjected to pulverization using a disk mill, a planetary mill, or the like, thereby preparing a glass frit.

The glass frit may have an average particle diameter (D50) of about 0.1 μm to about 10 μm, and may have a spherical or amorphous shape.

The glass frit may be present in an amount of about 0.1 wt % to about 20 wt %, preferably about 0.5 wt % to about 10 wt %, based on the total weight of the composition. Within this range, it is possible to secure p-n junction stability given varying surface resistances while minimizing serial resistance so as to improve solar cell efficiency.

(C) Organic Vehicle

The organic vehicle imparts suitable viscosity and rheological characteristics for printing to the composition for solar cell electrodes through mechanical mixing with the inorganic component of the composition.

The organic vehicle may be any typical organic vehicle used in solar cell electrode composition, and may include a binder resin, a solvent, and the like.

The binder resin may be selected from acrylate resins or cellulose resins. Ethyl cellulose is generally used as the binder resin. In addition, the binder resin may be selected from among ethyl hydroxyethyl cellulose, nitrocellulose, blends of ethyl cellulose and phenol resins, alkyd, phenol, acrylate ester, xylene, polybutane, polyester, urea, melamine, vinyl acetate resins, wood rosin, polymethacrylates of alcohols, and the like.

The solvent may be selected from the group consisting of, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, y-butyrolactone, ethyl lactate, and combinations thereof.

The organic vehicle may be present in an amount of about 1 wt % to about 30 wt % based on the total weight of the composition. Within this range, the organic vehicle may provide sufficient adhesive strength and excellent printability to the composition.

(D) Additives

The composition may further include typical additives to enhance flow and process properties and stability, as needed. The additives may include dispersants, thixotropic agents, plasticizers, viscosity stabilizers, anti-foaming agents, pigments, UV stabilizers, antioxidants, coupling agents, and the like, without being limited thereto. These additives may be used alone or as mixtures thereof. These additives may be present in the composition in an amount of about 0.1 wt % to about 5 wt %, without being limited thereto.

Solar Cell Electrode and Solar Cell Including the Same

Other aspects of the invention relate to an electrode formed of the composition for solar cell electrodes and a solar cell including the same. FIG. 1 shows a solar cell in accordance with one embodiment of the invention.

Referring to FIG. 1, a rear electrode 210 and a front electrode 230 may be formed by printing and baking the composition on a wafer or substrate 100 that includes a p-layer (or n-layer) 101 and an n-layer (or p-layer) 102, which will serve as an emitter. For example, a preliminary process of preparing the rear electrode 210 is performed by printing the composition on the rear surface of the wafer 100 and drying the printed composition at about 200° C. to about 400° C. for about 10 seconds to about 90 seconds. Further, a preliminary process for preparing the front electrode may be performed by printing the paste on the front surface of the wafer and drying the printed composition. Then, the front electrode 230 and the rear electrode 210 may be formed by baking the wafer at 600° C. to 1000° C., preferably at 750° C. to 950° C., for 30 seconds to 180 seconds.

Next, the present invention will be described in more detail with reference to examples. However, it should be noted that these examples are provided for illustration only and should not be construed in any way as limiting the invention.

MODE FOR INVENTION

Examples 1 to 84 and Comparative Examples 1 to 2

Preparation of Glass Frit

Glass frits of Examples and Comparative Examples were prepared according to the compositions as listed in Table 1 to 5. The prepared glass frits were evaluated as to the content (unit: mole %) of elemental silver therein using an Inductively Coupled Plasma-Optical Emission Spectrometer (ICP-OES). Representative results of which are shown in Table 6.

Example 1

As an organic binder, 3.0 wt % of ethylcellulose (STD4, Dow Chemical Company) was sufficiently dissolved in 6.5 wt % of butyl carbitol at 60° C., and 86.90 wt % of spherical silver powder (AG-4-8, Dowa Hightech Co., Ltd.) having an average particle diameter of 2.0 μm, 3.1 wt % of a glass frit prepared according to the composition as listed in Table 1, 0.2 wt % of a dispersant BYK102 (BYK-Chemie), and 0.3 wt % of a thixotropic agent Thixatrol ST (Elementis Co., Ltd.) were added to the binder solution, followed by mixing and kneading in a 3-roll kneader, thereby preparing a composition for solar cell electrodes.

Examples 2 to 42

Compositions for solar cell electrodes were prepared in the same manner as in Example 1 except that the glass frits were prepared according to the compositions as listed in Table 1 and 2.

Examples 43 to 84

Compositions for solar cell electrodes were prepared in the same manner as in Example 1 except that the glass frits containing silver nitrate were prepared according to the compositions as listed in Table 3 and 4.

Comparative Examples 1 to 2

Compositions for solar cell electrodes were prepared in the same manner as in Example 1 except that the glass frits were prepared according to the compositions as listed in Table 5.

TABLE 1

(unit: wt %)

| | AgC | PbO | $Bi_2O_3$ | $TeO_2$ | $P_2O_5$ | $Li_2CO_3$ | $SiO_2$ | ZnO | $WO_3$ | MgO | $CeO_2$ | $SrCO_3$ | $MoO_3$ | $TiO_2$ | SnO | $In_2O_3$ |
|---|---|---|---|---|---|---|---|---|---|---|---|---|---|---|---|---|
| Example 1 | 1 | — | 40 | 50 | — | 2 | 7 | — | — | — | — | — | — | — | — | — |
| Example 2 | 5 | — | 40 | 50 | — | 2 | 3 | — | — | — | — | — | — | — | — | — |
| Example 3 | 10 | — | 35 | 50 | — | 2 | 3 | — | — | — | — | — | — | — | — | — |

TABLE 1-continued (unit: wt %)

| | AgC | PbO | Bi$_2$O$_3$ | TeO$_2$ | P$_2$O$_5$ | Li$_2$CO$_3$ | SiO$_2$ | ZnO | WO$_3$ | MgO | CeO$_2$ | SrCO$_3$ | MoO$_3$ | TiO$_2$ | SnO | In$_2$O$_3$ |
|---|---|---|---|---|---|---|---|---|---|---|---|---|---|---|---|---|
| Example 4 | 20 | — | 30 | 40 | — | 2 | 8 | — | — | — | — | — | — | — | — | — |
| Example 5 | 30 | — | 25 | 35 | — | 2 | 8 | — | — | — | — | — | — | — | — | — |
| Example 6 | 1 | 40 | — | 50 | — | 2 | 7 | — | — | — | — | — | — | — | — | — |
| Example 7 | 5 | 40 | — | 50 | — | 2 | 3 | — | — | — | — | — | — | — | — | — |
| Example 8 | 10 | 35 | — | 50 | — | 2 | 3 | — | — | — | — | — | — | — | — | — |
| Example 9 | 20 | 30 | — | 40 | — | 2 | 8 | — | — | — | — | — | — | — | — | — |
| Example 10 | 40 | — | — | 50 | — | 2 | 8 | — | — | — | — | — | — | — | — | — |
| Example 11 | 1 | — | — | 50 | 40 | 2 | 7 | — | — | — | — | — | — | — | — | — |
| Example 12 | 5 | — | — | 50 | 40 | 2 | 3 | — | — | — | — | — | — | — | — | — |
| Example 13 | 10 | — | — | 50 | 35 | 2 | 3 | — | — | — | — | — | — | — | — | — |
| Example 14 | 20 | — | — | 40 | 30 | 2 | 8 | — | — | — | — | — | — | — | — | — |
| Example 15 | 30 | — | — | 35 | 25 | 2 | 8 | — | — | — | — | — | — | — | — | — |
| Example 16 | 1 | — | 40 | 50 | — | 2 | 5 | 2 | — | — | — | — | — | — | — | — |
| Example 17 | 5 | — | 40 | 50 | — | 2 | 2 | — | 1 | — | — | — | — | — | — | — |
| Example 18 | 10 | — | 35 | 50 | — | 2 | 2 | — | — | 1 | — | — | — | — | — | — |
| Example 19 | 20 | — | 30 | 40 | — | 2 | 5 | — | — | — | — | — | 3 | — | — | — |
| Example 20 | 30 | — | 25 | 35 | — | 2 | 5 | — | — | — | — | — | — | 3 | — | — |

TABLE 2

(unit: wt %)

| | AgCN | PbO | Bi$_2$O$_3$ | TeO$_2$ | P$_2$O$_5$ | Li$_2$CO$_3$ | SiO$_2$ | ZnO | WO$_3$ | MgO | CeO$_2$ | SrCO$_3$ | MoO$_3$ | TiO$_2$ | SnO | In$_2$O$_3$ |
|---|---|---|---|---|---|---|---|---|---|---|---|---|---|---|---|---|
| Example 21 | 1 | 40 | 20 | — | — | 2 | 5 | — | — | — | — | 32 | — | — | — | — |
| Example 22 | 5 | 40 | 40 | — | — | 2 | 2 | — | — | — | — | 11 | — | — | — | — |
| Example 23 | 10 | 35 | 35 | — | — | 2 | 2 | — | — | — | — | 16 | — | — | — | — |
| Example 24 | 20 | 30 | 30 | — | — | 2 | 5 | — | — | — | — | 13 | — | — | — | — |
| Example 25 | 30 | 25 | 25 | — | — | 2 | 5 | — | — | — | — | 13 | — | — | — | — |
| Example 26 | 1 | 40 | 20 | — | — | 2 | 5 | — | — | — | 32 | — | — | — | — | — |
| Example 27 | 5 | 40 | 40 | — | — | 2 | 2 | — | — | — | 11 | — | — | — | — | — |
| Example 28 | 10 | 35 | 35 | — | — | 2 | 2 | — | — | — | 16 | — | — | — | — | — |
| Example 29 | 20 | 30 | 30 | — | — | 2 | 5 | — | — | — | 13 | — | — | — | — | — |
| Example 30 | 30 | 25 | 25 | — | — | 2 | 5 | — | — | — | 13 | — | — | — | — | — |
| Example 31 | 18 | — | 30 | 40 | — | 2 | 8 | — | — | — | — | — | — | — | — | 2 |
| Example 32 | 18 | — | 30 | 40 | — | 2 | 8 | — | — | — | — | — | — | 2 | — | — |
| Example 33 | 1 | — | 40 | 50 | — | 2 | — | 7 | — | — | — | — | — | — | — | — |
| Example 34 | 5 | — | 40 | 50 | — | 2 | — | 3 | — | — | — | — | — | — | — | — |
| Example 35 | 10 | — | 35 | 50 | — | 2 | — | 3 | — | — | — | — | — | — | — | — |
| Example 36 | 20 | — | 30 | 40 | — | 2 | — | 8 | — | — | — | — | — | — | — | — |
| Example 37 | 30 | — | 25 | 35 | — | 2 | — | 8 | — | — | — | — | — | — | — | — |
| Example 38 | 1 | — | 40 | 50 | — | 2 | — | — | — | — | 7 | — | — | — | — | — |
| Example 39 | 5 | — | 40 | 50 | — | 2 | — | — | 1 | — | — | 2 | — | — | — | — |
| Example 40 | 10 | — | 35 | 50 | — | 2 | — | — | — | 1 | 2 | — | — | — | — | — |
| Example 41 | 20 | — | 30 | 40 | — | 2 | — | — | — | — | — | 5 | 3 | — | — | — |
| Example 42 | 30 | — | 25 | 35 | — | 2 | — | 5 | — | — | — | — | — | — | 3 | — |

TABLE 3

(unit: wt %)

| | AgNO$_3$ | PbO | Bi$_2$O$_3$ | TeO$_2$ | P$_2$O$_5$ | Li$_2$CO$_3$ | SiO$_2$ | ZnO | WO$_3$ | MgO | CeO | SrCO$_3$ | MoO$_3$ | TiO$_2$ | SnO | In$_2$O$_3$ |
|---|---|---|---|---|---|---|---|---|---|---|---|---|---|---|---|---|
| Example 43 | 1 | — | 40 | 50 | — | 2 | 7 | — | — | — | — | — | — | — | — | — |
| Example 44 | 5 | — | 40 | 50 | — | 2 | 3 | — | — | — | — | — | — | — | — | — |
| Example 45 | 10 | — | 35 | 50 | — | 2 | 3 | — | — | — | — | — | — | — | — | — |
| Example 46 | 20 | — | 30 | 40 | — | 2 | 8 | — | — | — | — | — | — | — | — | — |
| Example 47 | 40 | — | 5 | 45 | — | 2 | 8 | — | — | — | — | — | — | — | — | — |
| Example 48 | 1 | 40 | — | 50 | — | 2 | 7 | — | — | — | — | — | — | — | — | — |
| Example 49 | 5 | 40 | — | 50 | — | 2 | 3 | — | — | — | — | — | — | — | — | — |
| Example 50 | 10 | 35 | — | 50 | — | 2 | 3 | — | — | — | — | — | — | — | — | — |
| Example 51 | 20 | 30 | — | 40 | — | 2 | 8 | — | — | — | — | — | — | — | — | — |
| Example 52 | 30 | 25 | — | 35 | — | 2 | 8 | — | — | — | — | — | — | — | — | — |
| Example 53 | 1 | — | — | 50 | 40 | 2 | 7 | — | — | — | — | — | — | — | — | — |
| Example 54 | 5 | — | — | 50 | 40 | 2 | 3 | — | — | — | — | — | — | — | — | — |
| Example 55 | 10 | — | — | 50 | 35 | 2 | 3 | — | — | — | — | — | — | — | — | — |
| Example 56 | 20 | — | — | 40 | 30 | 2 | 8 | — | — | — | — | — | — | — | — | — |

TABLE 3-continued (unit: wt %)

| | AgNO$_3$ | PbO | Bi$_2$O$_3$ | TeO$_2$ | P$_2$O$_5$ | Li$_2$CO$_3$ | SiO$_2$ | ZnO | WO$_3$ | MgO | CeO | SrCO$_3$ | MoO$_3$ | TiO$_2$ | SnO | In$_2$O$_3$ |
|---|---|---|---|---|---|---|---|---|---|---|---|---|---|---|---|---|
| Example 57 | 30 | — | — | 35 | 25 | 2 | 8 | — | — | — | — | — | — | — | — | — |
| Example 58 | 1 | — | 40 | 50 | — | 2 | 5 | 2 | — | — | — | — | — | — | — | — |
| Example 59 | 5 | — | 40 | 50 | — | 2 | 2 | — | 1 | — | — | — | — | — | — | — |
| Example 60 | 10 | — | 35 | 50 | — | 2 | 2 | — | — | 1 | — | — | — | — | — | — |
| Example 61 | 20 | — | 30 | 40 | — | 2 | 5 | — | — | — | — | — | 3 | — | — | — |
| Example 62 | 30 | — | 25 | 35 | — | 2 | 5 | — | — | — | — | — | — | — | 3 | — |
| Example 63 | 1 | 40 | 20 | — | — | 2 | 5 | — | — | — | — | 32 | — | — | — | — |

TABLE 4

(unit: wt %)

| | AgNO$_3$ | PbO | Bi$_2$O$_3$ | TeO$_2$ | P$_2$O$_5$ | Li$_2$CO$_3$ | SiO$_2$ | ZnO | WO$_3$ | MgO | CeO$_2$ | SrCO$_3$ | MoO$_3$ | TiO$_2$ | SnO | In$_2$O$_3$ |
|---|---|---|---|---|---|---|---|---|---|---|---|---|---|---|---|---|
| Example 64 | 5 | 40 | 40 | — | — | 2 | 2 | — | — | — | — | 11 | — | — | — | — |
| Example 65 | 10 | 35 | 35 | — | — | 2 | 2 | — | — | — | — | 16 | — | — | — | — |
| Example 66 | 20 | 30 | 30 | — | — | 2 | 5 | — | — | — | — | 13 | — | — | — | — |
| Example 67 | 30 | 25 | 25 | — | — | 2 | 5 | — | — | — | — | 13 | — | — | — | — |
| Example 68 | 1 | 40 | 20 | — | — | 2 | 5 | — | — | — | 32 | — | — | — | — | — |
| Example 69 | 5 | 40 | 40 | — | — | 2 | 2 | — | — | — | 11 | — | — | — | — | — |
| Example 70 | 10 | 35 | 35 | — | — | 2 | 2 | — | — | — | 16 | — | — | — | — | — |
| Example 71 | 20 | 30 | 30 | — | — | 2 | 5 | — | — | — | 13 | — | — | — | — | — |
| Example 72 | 30 | 25 | 25 | — | — | 2 | 5 | — | — | — | 13 | — | — | — | — | — |
| Example 73 | 18 | — | 30 | 40 | — | 2 | 8 | — | — | — | — | — | — | — | — | 2 |
| Example 74 | 18 | — | 30 | 40 | — | 2 | 8 | — | — | — | — | — | — | 2 | — | — |
| Example 75 | 1 | — | 40 | 50 | — | 2 | — | 7 | — | — | — | — | — | — | — | — |
| Example 76 | 5 | — | 40 | 50 | — | 2 | — | 3 | — | — | — | — | — | — | — | — |
| Example 77 | 10 | — | 35 | 50 | — | 2 | — | 3 | — | — | — | — | — | — | — | — |
| Example 78 | 20 | — | 30 | 40 | — | 2 | — | 8 | — | — | — | — | — | — | — | — |
| Example 79 | 30 | — | 25 | 35 | — | 2 | — | 8 | — | — | — | — | — | — | — | — |
| Example 80 | 1 | — | 40 | 50 | — | 2 | — | — | — | — | 7 | — | — | — | — | — |
| Example 81 | 5 | — | 40 | 50 | — | 2 | — | — | 1 | — | — | 2 | — | — | — | — |
| Example 82 | 10 | — | 35 | 50 | — | 2 | — | — | — | 1 | 2 | — | — | — | — | — |
| Example 83 | 20 | — | 30 | 40 | — | 2 | — | — | — | — | — | 5 | 3 | — | — | — |
| Example 84 | 30 | — | 25 | 35 | — | 2 | — | 5 | — | — | — | — | — | — | 3 | — |

TABLE 5

(unit: wt %)

| | AgCN | PbO | Bi$_2$O$_3$ | TeO$_2$ | P$_2$O$_5$ | Li$_2$CO$_3$ | SiO$_2$ | ZnO | WO$_3$ | MgO | CeO$_2$ | SrCO$_3$ | MoO$_3$ | TiO$_2$ | SnO | In$_2$O$_3$ |
|---|---|---|---|---|---|---|---|---|---|---|---|---|---|---|---|---|
| Comparative Example 1 | — | 40 | 50 | — | — | 2 | 8 | — | — | — | — | — | — | — | — | — |
| Comparative Example 2 | — | 50 | 40 | — | — | 2 | 8 | — | — | — | — | — | — | — | — | — |

Measurement of Content of Elemental Silver in Glass Frit Using ICP-OES

Pretreatment of samples: 0.01 g of a glass frit sample to be analyzed was placed in a beaker and correctly weighed to within ±0.0001 g. 200 ml of 5 mole % sulfuric acid (H$_2$SO$_4$) was added to the beaker, followed by heating at 220° C. for 3 hours using a hot plate, thereby completely carbonizing the sample. Hydrogen peroxide (H$_2$O$_2$) was added to the beaker until the beaker containing the carbonized sample became transparent, thereby completing pretreatment.

Preparation of Standard Solution:

An elemental silver standard solution (Ag+1000 mg/L) for measuring elements was prepared.

Measurement of Content of Elemental Silver:

Nitric acid was added to the beaker containing the pretreated sample, followed by heating for 5 minutes and air cooling. The prepared standard was introduced into an ICP-OES tester and a calibration curve was plotted by an external standard method, followed by measuring and converting the concentration (ppm) of the elemental silver in the sample using the ICP-OES tester (PerkinElmer, Inc.), thereby calculating the concentration of the elemental silver in the glass frit.

Content of elemental silver (%)=Concentration of element (ppm)×Dilution Factor (DF)/10000

Mole of elemental silver=Content of elemental silver/Molecular weight of elemental silver Mole % of elemental silver=Mole of elemental silver/total mole number of all elements

TABLE 6

| | Content of elemental silver (mole %) | | Content of elemental silver (mole %) | | Content of elemental silver (mole %) |
|---|---|---|---|---|---|
| Example 6 | 1.24 | Example 21 | 1.62 | Example 33 | 1.41 |
| Example 7 | 6.12 | Example 22 | 8.78 | Example 34 | 7.60 |
| Example 8 | 12.51 | Example 23 | 16.74 | Example 35 | 14.42 |
| Example 9 | 23.25 | Example 24 | 30.11 | Example 36 | 26.00 |
| Example 10 | 43.58 | Example 25 | 42.25 | Example 37 | 36.85 |
| Example 43 | 0.95 | Example 63 | 0.99 | Example 75 | 0.91 |
| Example 44 | 5.02 | Example 64 | 5.69 | Example 76 | 4.89 |
| Example 45 | 9.77 | Example 65 | 11.10 | Example 77 | 9.56 |
| Example 46 | 18.45 | Example 66 | 21.19 | Example 78 | 17.91 |
| Example 47 | 32.98 | Example 67 | 31.20 | Example 79 | 26.51 |
| Comparative Example 1 | 0 | Comparative Example 2 | 0 | — | — |

Measurement Method of Contact Resistance and Specific Contact Resistivity

The compositions prepared in the examples and comparative example were deposited onto a front surface of a crystalline mono-wafer by screen printing in a predetermined pattern, followed by drying in an IR drying furnace. Cells formed according to this procedure were subjected to baking at 600° C. to 900° C. for 60 seconds to 210 seconds in a belt-type baking furnace, and then evaluated as to contact resistance (Rs) and specific contact resistivity (ρc) using a TLM (Transfer Length Method) tester. The measured contact resistance and specific contact resistivity are shown in Table 7 to Table 11.

Measurement Method of Serial Resistance, Fill Factor, and Conversion Efficiency The compositions prepared in the examples and comparative examples were deposited over a front surface of a crystalline mono-wafer by screen printing in a predetermined pattern, followed by drying in an IR drying furnace. Then, the aluminum paste was printed on a rear side of the wafer and dried in the same manner as above. Cells formed according to this procedure were subjected to baking at 400° C. to 900° C. for 30 seconds to 180 seconds in a belt-type baking furnace, and evaluated as to serial resistance (Rs), Fill Factor (FF, %), and conversion efficiency (%) using a solar cell efficiency tester CT-801 (Pasan Co., Ltd.). The measured serial resistance, fill factor, and conversion efficiency are shown in Table 7 to Table 11.

TABLE 7

| Sample | Contact Resistance (Rc) (mΩ) | Specific contact resistivity (mΩ·cm$^2$) | Serial Resistance (Rs) (mΩ) | Fill Factor | Efficiency (%) |
|---|---|---|---|---|---|
| Example 1 | 0.5389 | 0.9544 | 5.24 | 76.45 | 16.55 |
| Example 2 | 0.4699 | 0.7875 | 5.03 | 76.66 | 16.77 |
| Example 3 | 0.4314 | 0.6743 | 4.80 | 76.86 | 17.00 |
| Example 4 | 0.3838 | 0.6203 | 4.54 | 77.05 | 17.21 |
| Example 5 | 0.3078 | 0.4837 | 5.27 | 76.44 | 16.54 |
| Example 6 | 0.5364 | 0.9459 | 5.03 | 76.68 | 16.78 |
| Example 7 | 0.4692 | 0.7782 | 4.80 | 76.87 | 17.00 |
| Example 8 | 0.4308 | 0.6728 | 4.55 | 77.05 | 17.21 |
| Example 9 | 0.3835 | 0.6169 | 5.24 | 76.45 | 16.55 |
| Example 10 | 0.2952 | 0.4801 | 5.04 | 76.64 | 16.77 |
| Example 11 | 0.5232 | 0.9380 | 4.81 | 76.84 | 16.98 |
| Example 12 | 0.4738 | 0.7886 | 4.72 | 76.96 | 17.07 |
| Example 13 | 0.4347 | 0.6748 | 4.48 | 77.07 | 17.22 |
| Example 14 | 0.3855 | 0.6211 | 5.24 | 76.45 | 16.55 |
| Example 15 | 0.3093 | 0.4974 | 5.03 | 76.66 | 16.77 |
| Example 16 | 0.5228 | 0.9329 | 5.24 | 76.45 | 16.56 |
| Example 17 | 0.4683 | 0.7766 | 5.02 | 76.68 | 16.80 |
| Example 18 | 0.4372 | 0.6832 | 4.82 | 76.84 | 16.98 |
| Example 19 | 0.3861 | 0.6222 | 4.72 | 76.96 | 17.08 |
| Example 20 | 0.3124 | 0.5007 | 4.54 | 77.06 | 17.21 |

TABLE 8

| Sample | Contact Resistance (Rc) (mΩ) | Specific contact resistivity (mΩ·cm$^2$) | Serial Resistance (Rs) (mΩ) | Fill Factor | Efficiency (%) |
|---|---|---|---|---|---|
| Example 21 | 0.4993 | 0.8839 | 5.28 | 76.44 | 16.53 |
| Example 22 | 0.4744 | 0.7915 | 5.05 | 76.64 | 16.77 |
| Example 23 | 0.4372 | 0.6897 | 4.82 | 76.82 | 16.97 |
| Example 24 | 0.3873 | 0.6258 | 4.61 | 77.04 | 17.19 |
| Example 25 | 0.3141 | 0.5115 | 4.40 | 77.12 | 17.29 |
| Example 26 | 0.5079 | 0.9095 | 5.24 | 76.47 | 16.57 |
| Example 27 | 0.4681 | 0.7668 | 5.00 | 76.69 | 16.80 |
| Example 28 | 0.4287 | 0.6691 | 4.79 | 76.90 | 17.00 |
| Example 29 | 0.3821 | 0.6100 | 4.71 | 76.97 | 17.11 |
| Example 30 | 0.2906 | 0.4602 | 4.47 | 77.08 | 17.25 |
| Example 31 | 0.3894 | 0.6282 | 4.70 | 76.98 | 17.12 |
| Example 32 | 0.3787 | 0.6048 | 4.67 | 77.00 | 17.14 |
| Example 33 | 0.5147 | 0.9227 | 5.28 | 76.41 | 16.52 |
| Example 34 | 0.4650 | 0.7620 | 5.06 | 76.63 | 16.76 |
| Example 35 | 0.4283 | 0.6690 | 4.83 | 76.81 | 16.97 |
| Example 36 | 0.3620 | 0.5724 | 4.73 | 76.96 | 17.05 |
| Example 37 | 0.2898 | 0.4445 | 4.45 | 77.09 | 17.25 |
| Example 38 | 0.5156 | 0.9277 | 5.23 | 76.48 | 16.60 |
| Example 39 | 0.4751 | 0.7943 | 4.99 | 76.69 | 16.82 |
| Example 40 | 0.4397 | 0.6898 | 4.75 | 76.90 | 17.01 |
| Example 41 | 0.3787 | 0.6048 | 4.63 | 77.04 | 17.19 |
| Example 42 | 0.2783 | 0.4558 | 4.42 | 77.09 | 17.27 |

TABLE 9

| Sample | Contact Resistance (Rc) (mΩ) | Specific contact resistivity (mΩ·cm$^2$) | Serial Resistance (Rs) (mΩ) | Fill Factor | Efficiency (%) |
|---|---|---|---|---|---|
| Example 43 | 0.4840 | 0.7717 | 5.39 | 76.38 | 16.49 |
| Example 44 | 0.4446 | 0.6979 | 5.18 | 76.59 | 16.64 |
| Example 45 | 0.4116 | 0.6061 | 5.02 | 76.68 | 16.83 |
| Example 46 | 0.3759 | 0.5488 | 4.85 | 76.96 | 17.02 |
| Example 47 | 0.3136 | 0.4639 | 4.58 | 77.19 | 17.36 |

TABLE 9-continued

| Sample | Contact Resistance (Rc) (mΩ) | Specific contact resistivity (mΩ · cm²) | Serial Resistance (Rs) (mΩ) | Fill Factor | Efficiency (%) |
|---|---|---|---|---|---|
| Example 48 | 0.4853 | 0.7739 | 5.36 | 76.40 | 16.51 |
| Example 49 | 0.4409 | 0.6958 | 5.17 | 76.60 | 16.67 |
| Example 50 | 0.4126 | 0.6106 | 5.01 | 76.68 | 16.85 |
| Example 51 | 0.3756 | 0.5469 | 4.85 | 76.95 | 17.01 |
| Example 52 | 0.3226 | 0.4733 | 4.59 | 77.18 | 17.35 |
| Example 53 | 0.4833 | 0.7705 | 5.56 | 76.38 | 16.46 |
| Example 54 | 0.4456 | 0.6982 | 5.18 | 76.59 | 16.62 |
| Example 55 | 0.4111 | 0.5969 | 5.01 | 76.70 | 16.85 |
| Example 56 | 0.3774 | 0.5594 | 4.85 | 76.97 | 17.02 |
| Example 57 | 0.3135 | 0.4597 | 4.60 | 77.18 | 17.35 |
| Example 58 | 0.4984 | 0.8082 | 5.57 | 76.35 | 16.42 |
| Example 59 | 0.4402 | 0.6956 | 5.19 | 76.58 | 16.61 |
| Example 60 | 0.4140 | 0.6115 | 5.03 | 76.68 | 16.81 |
| Example 61 | 0.3740 | 0.5449 | 4.86 | 76.93 | 17.00 |
| Example 62 | 0.3308 | 0.4913 | 4.51 | 77.21 | 17.37 |
| Example 63 | 0.4909 | 0.7818 | 5.36 | 76.41 | 16.53 |

TABLE 10

| Sample | Contact Resistance (Rc) (mΩ) | Specific contact resistivity (mΩ · cm²) | Serial Resistance (Rs) (mΩ) | Fill Factor | Efficiency (%) |
|---|---|---|---|---|---|
| Example 64 | 0.4460 | 0.7094 | 5.17 | 76.61 | 16.68 |
| Example 65 | 0.4144 | 0.6222 | 5.00 | 76.70 | 16.86 |
| Example 66 | 0.3662 | 0.5432 | 4.86 | 76.93 | 16.99 |
| Example 67 | 0.3308 | 0.4913 | 4.60 | 77.16 | 17.34 |
| Example 68 | 0.4915 | 0.7884 | 5.33 | 76.44 | 16.53 |
| Example 69 | 0.4460 | 0.7035 | 5.19 | 76.57 | 16.60 |
| Example 70 | 0.4173 | 0.6384 | 5.00 | 76.71 | 16.86 |
| Example 71 | 0.3775 | 0.5637 | 4.87 | 76.92 | 16.98 |
| Example 72 | 0.2987 | 0.4461 | 4.50 | 77.22 | 17.38 |
| Example 73 | 0.3358 | 0.5048 | 4.88 | 76.91 | 16.98 |
| Example 74 | 0.3413 | 0.5155 | 4.89 | 76.87 | 16.97 |
| Example 75 | 0.4826 | 0.7689 | 5.69 | 76.16 | 16.20 |
| Example 76 | 0.4462 | 0.7112 | 5.17 | 76.63 | 16.68 |
| Example 77 | 0.4204 | 0.6387 | 5.00 | 76.71 | 16.86 |
| Example 78 | 0.3775 | 0.5714 | 4.84 | 76.97 | 17.04 |
| Example 79 | 0.2925 | 0.3887 | 4.60 | 77.15 | 17.33 |
| Example 80 | 0.4760 | 0.7594 | 5.15 | 76.63 | 16.69 |
| Example 81 | 0.4581 | 0.7391 | 5.04 | 76.67 | 16.79 |
| Example 82 | 0.4468 | 0.7183 | 4.91 | 76.83 | 16.93 |
| Example 83 | 0.4221 | 0.6500 | 4.62 | 77.15 | 17.31 |
| Example 84 | 0.2922 | 0.3882 | 4.48 | 77.22 | 17.40 |

TABLE 11

| Sample | Contact Resistance (Rc) (mΩ) | Specific contact resistivity (mΩ · cm²) | Serial Resistance (Rs) (mΩ) | Fill Factor | Efficiency (%) |
|---|---|---|---|---|---|
| Comparative Example 1 | 0.9281 | 1.5338 | 8.03 | 73.90 | 14.83 |
| Comparative Example 2 | 0.8461 | 1.4611 | 7.39 | 74.01 | 15.01 |

As shown in Table 7 to Table 11, it could be seen that the solar cell electrodes fabricated using the compositions prepared using the glass frit that contains elemental silver originating from silver cyanide in Examples 1 to 42 and the solar cell electrodes fabricated using the compositions prepared using the glass frit that contains elemental silver deriving from silver nitrate in Examples 43 to 84 had considerably low contact resistance, specific contact resistivity, and serial resistance, thereby providing excellent fill factor and conversion efficiency, as compared with those of Comparative Example 1 to 2 in which the glass frit originating from metal oxide was used.

It should be understood that various modifications, changes, alterations, and equivalent embodiments can be made by those skilled in the art without departing from the spirit and scope of the invention.

The invention claimed is:

1. A composition for solar cell electrodes, comprising: about 60 wt % to about 95 wt % of a silver (Ag) powder; about 0.1 wt % to about 20 wt % of a glass frit containing about 0.1 mole % to about 50 mole % of elemental silver; and about 1 wt % to about 30 wt % of an organic vehicle.

2. The composition according to claim 1, wherein the elemental silver derives from silver cyanide or silver nitrate.

3. The composition according to claim 1, wherein the glass fit contains about 0.9 mole % to about 45 mole % of elemental silver.

4. The composition according to claim 1, wherein the glass frit is formed from silver cyanide, silver nitrate or a mixture thereof; and at least one metal oxide.

5. The composition according to claim 4, wherein the metal oxide includes one or more of lead oxide, bismuth oxide, tellurium oxide, phosphorus oxide, germanium oxide, gallium oxide, cerium oxide, iron oxide, lithium oxide, silicon oxide, zinc oxide, tungsten oxide, magnesium oxide, cesium oxide, strontium oxide, molybdenum oxide, titanium oxide, tin oxide, indium oxide, vanadium oxide, barium oxide, nickel oxide, copper oxide, sodium oxide, potassium oxide, arsenic oxide, cobalt oxide, zirconium oxide, manganese oxide, or aluminum oxide.

6. The composition according to claim 1, wherein the glass fit has an average particle diameter (D50) of about 0.1 μm to about 10 μm.

7. The composition according to claim 1, further comprising: one or more of a dispersant, a thixotropic agent, a plasticizer, a viscosity stabilizer, an anti-foaming agent, a pigment, a UV stabilizer, an antioxidant, and a coupling agent.

8. A solar cell electrode prepared from the composition for solar cell electrodes according to claim 1.

9. A method of fabricating a solar cell, the method comprising:
disposing the composition as claimed in claim 1 on a substrate in a pattern for an electrode; and
forming an electrode on the substrate, forming the electrode including firing the substrate having the composition pattern thereon.

* * * * *